US008508960B2

(12) United States Patent
Chen et al.

(10) Patent No.: US 8,508,960 B2
(45) Date of Patent: Aug. 13, 2013

(54) VOLTAGE DETECTOR AND PROTECTION APPARATUS USING THE SAME

(75) Inventors: Yu-Ming Chen, Hsinchu (TW); Pei-Lun Huang, Zhubei (TW); Kuo-Chin Chiu, Xinfeng Township, Hsinchu County (TW)

(73) Assignee: Richpower Microelectronics Corporation, British West Indies (KY)

( * ) Notice: Subject to any disclaimer, the term of this patent is extended or adjusted under 35 U.S.C. 154(b) by 315 days.

(21) Appl. No.: 13/078,117

(22) Filed: Apr. 1, 2011

(65) Prior Publication Data

US 2011/0249476 A1    Oct. 13, 2011

(30) Foreign Application Priority Data

Apr. 7, 2010   (TW) ................................ 99110690 A

(51) Int. Cl.
*H02M 3/335*    (2006.01)

(52) U.S. Cl.
USPC ........................ 363/21.16; 361/58

(58) Field of Classification Search
USPC .................. 363/16–17, 20, 25, 21.12, 21.13, 363/21.16, 44, 49, 50, 56.1, 56.07, 80, 86, 363/97; 361/22, 42, 45, 93.6, 54, 56, 104, 361/198, 58; 307/12, 82, 125, 127, 131, 307/140, 118; 323/222, 267, 272, 275, 280, 323/282–285, 313, 901
See application file for complete search history.

(56) References Cited

U.S. PATENT DOCUMENTS

| | | | | |
|---|---|---|---|---|
| 4,367,376 A | * | 1/1983 | Proctor et al. | 340/328 |
| 5,565,761 A | * | 10/1996 | Hwang | 323/222 |
| 6,839,247 B1 | * | 1/2005 | Yang et al. | 363/21.11 |
| 7,248,097 B2 | * | 7/2007 | Montgomery | 327/538 |

\* cited by examiner

*Primary Examiner* — Rajnikant Patel
(74) *Attorney, Agent, or Firm* — Rosenberg, Klein & Lee

(57) ABSTRACT

A voltage detector includes a zener diode having a cathode connected to a detect terminal of the voltage detector, a junction field effect transistor having an input terminal connected to an anode of the zener diode, and a resistor connected between an output terminal and a control terminal of the junction field effect transistor. When the voltage on the detect terminal is higher than the breakdown voltage of the zener diode, the junction field effect transistor produces a current flowing through the resistor, and thereby a detection signal can be obtained from the voltage across the resistor.

11 Claims, 9 Drawing Sheets

VOLTAGE DETECTOR AND PROTECTION APPARATUS USING THE SAME

FIELD OF THE INVENTION

The present invention is related to a voltage detector and a protection apparatus using the voltage detector.

BACKGROUND OF THE INVENTION

As shown in FIG. 1, a conventional AC-DC switching power converter 10 has a pair of AC power input terminals 12 and 14 for connecting to an AC power source, a high-frequency filter capacitor CX connected between the AC power input terminals 12 and 14 for filtering high-frequency signals to prevent high-frequency switching noises from interfering the power network, a bridge rectifier 16 for rectifying the AC input voltage to generate a DC voltage Vdc, and a voltage converter 18 for converting the DC voltage Vdc into a regulated output voltage Vo. When the AC power source is removed, the high-frequency filter capacitor CX will have a residue DC voltage thereon, whose level is equal to the voltage of the AC power source at the moment that the AC power source is removed, and thus may be the maximum voltage of the AC power source, e.g. $264\sqrt{2}V$. Such a high voltage stored in the filter capacitor CX can bring about risks of electric shock. Traditionally, a bleeding resistor RB is connected in parallel to the high-frequency filter capacitor CX, to release the residue voltage to a safe range in a specified time. However, the bleeding resistor RB causes additional power loss. Particularly, if the AC power source is 264 Vac, the power consumed by the bleeding resistor RB is $(264V)^2/RB$, which is expected to be as high as some tens of milliwatts.

In addition, when the AC power source is lower than a normal range and enters brownout state, the AC-DC switching power converter 10 may get damaged. An existing approach is to use a voltage detector with a resistor voltage divider to determine whether the AC power source is in brownout state. However, the resistor voltage divider leads to increased power loss because of its high voltage drop.

Therefore, it is desired a voltage detector for detecting a voltage state without increasing power loss.

SUMMARY OF THE INVENTION

An objective of the present invention is to provide a voltage detector implemented by using the characteristics of a junction field effect transistor (JFET) and to provide a protection apparatus using the voltage detector.

Another objective of the present invention is to provide a voltage detector capable of identifying the status of the input voltage of an AC-DC switching power converter without power loss.

According to the present invention, a voltage detector has a detect terminal for receiving an input voltage, a junction field effect transistor, a zener diode having a cathode and an anode connected to the detect terminal and an input terminal of the junction field effect transistor, respectively, and a resistor connected between an output terminal and a control terminal of the junction field effect transistor. When the input voltage is lower than the breakdown voltage of the zener diode, the junction field effect transistor disables and there is no current flowing through the resistor. When the input voltage is higher than the breakdown voltage, the junction field effect transistor operates and produces a current flowing through the resistor. Therefore, according to the voltage drop across the resistor, a detection signal can be derived for identifying whether the input voltage is higher or lower than the breakdown voltage of the zener diode.

According to the present invention, a protection apparatus for an AC-DC switching power converter includes a rectifier circuit to rectify a first voltage across a high-frequency filter capacitor connected between two AC power input terminals to generate a second voltage, a voltage detector to detect the second voltage to generate a detection signal, and a brownout detect circuit to determine a brownout protection signal according to the detection signal. The voltage detector uses the characteristics of a junction field effect transistor to detect the second voltage in order to reduce power loss.

According to the present invention, a protection apparatus for an AC-DC switching power converter includes a rectifier circuit to rectify a first voltage across a high-frequency filter capacitor connected between two AC power input terminals to generate a second voltage, a voltage detector to detect the second voltage to generate a detection signal, a power-source-removal detect circuit to determine a power-source-removal signal according to the detection signal, and a switch connected between the high-frequency filter capacitor and a ground terminal to discharge the high-frequency filter capacitor in response to the power-source-removal signal. The voltage detector uses the characteristics of a junction field effect transistor to detect the second voltage in order to reduce power loss.

According to the present invention, a protection apparatus for an AC-DC switching power converter includes a rectifier circuit to rectify a first voltage across a high-frequency filter capacitor connected between two AC power input terminals to generate a second voltage, a voltage detector to detect the second voltage to generate a detection signal and to discharge the high-frequency filter capacitor in response to a power-source-removal signal, and a power-source-removal detect circuit to determine the power-source-removal signal according to the detection signal. The voltage detector uses the characteristics of a junction field effect transistor to detect the second voltage in order to reduce power loss.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
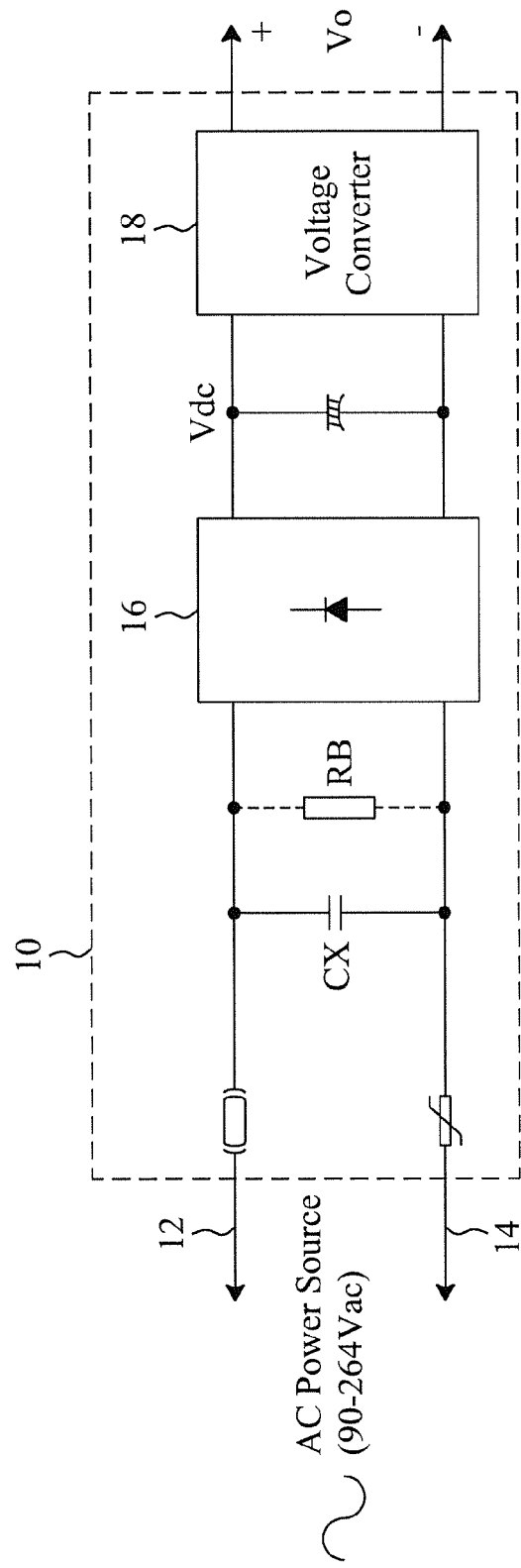
FIG. 1 is a circuit diagram of a conventional AC-DC switching power converter.
Figure 2:
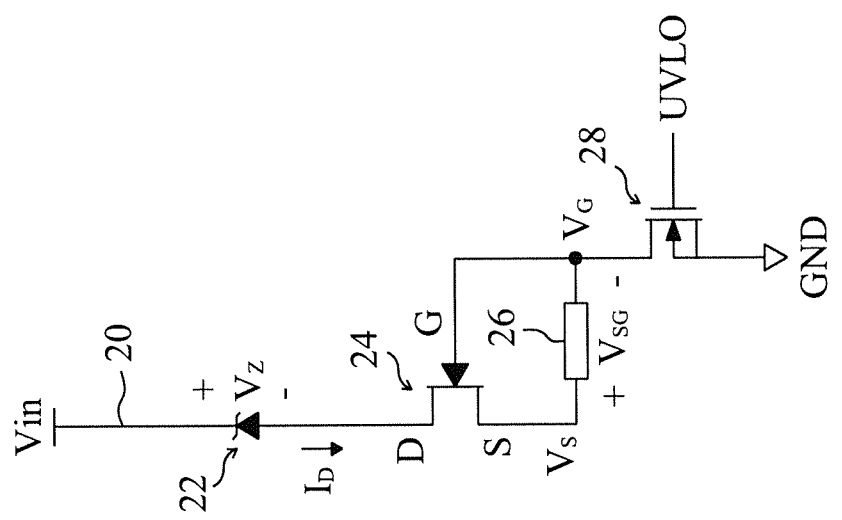
FIG. 2 is a circuit diagram of a voltage detector according to the present invention.
Figure 3:
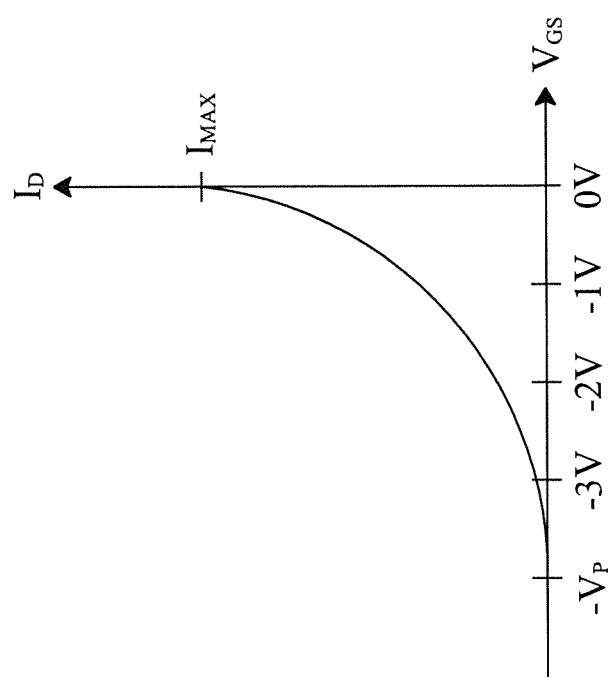
FIG. 3 is a diagram showing an I-V characteristic curve of a junction field effect transistor.

FIG. 2 is a circuit diagram of a voltage detector according to the present invention, which is used to detect an input voltage Vin to thereby generate a detection signal $V_S$. In this voltage detector, a zener diode 22 has a cathode connected to a detect terminal 20 which receives the input voltage Vin, a JFET 24 has a drain D acting as an input terminal connected to an anode of the zener diode 22, a source S acting as an output terminal and a gate G acting as a control terminal, a resistor 26 is connected between the source S and the gate G of the JFET 24, and a switch 28 is connected between the gate G of the JFET 24 and a ground GND, and controlled by a control signal UVLO. When the switch 28 is off, the voltage detector does not detect the input voltage Vin. When the switch 28 is on, if the input voltage Vin at the detect terminal 20 is higher than the breakdown voltage $V_Z$ of the zener diode 22, the JFET 24 operates and thereby produces a current $I_D$ flowing through the JFET 24 to the source S. Since the switch 28 is on, the gate G of the JFET 24 is grounded, and the current $I_D$ will flow through the resistor 26 to increase the source-gate voltage $V_{SG}$ of the JFET 24, i.e., the gate-source voltage $V_{GS}$ of the JFET 24 decreases. According to FIG. 3, where an I-V characteristic curve of a JFET is shown, the gate-source voltage $V_{GS}$ of the JFET 24 will become equal to the pinch-off voltage $-V_P$ of the JFET 24, and thus the voltage drop $V_{SG}$ across the resistor 26 will be equal to $V_P$. When the switch 28 is on, if the input voltage Vin is lower than the breakdown voltage $V_Z$ of the zener diode 22, there will be no current $I_D$ flowing through the JFET 24, and since the gate G of the JFET 24 is grounded, the JFET 24 has its source S and gate G at the same potential, i.e., the voltage drop $V_{SG}$ across the resistor 26 is zero. Because the leakage current of the JFET 24 is almost zero, the voltage detector has nearly no power loss when detecting the input voltage Vin.

As discussed above, according to the voltage drop $V_{SG}$ across the resistor 26, the voltage detector can determine whether the input voltage Vin is higher or lower than the breakdown voltage Vz of the zener diode 22, so that a detection signal can be derived from the voltage drop $V_{SG}$ across the resistor 26. In this embodiment, the gate G of the JFET 24 is grounded by the switch 28, so the source voltage $V_S$ of the JFET 24 can be directly taken as the detection signal. In this voltage detector, the breakdown voltage Vz of the zener diode 22 is taken as a reference voltage for detection, which may be altered by selecting or adjusting the breakdown voltage $V_Z$ of the zener diode 22 or by adding more zener diodes 22 connected in series.

Figure 4:
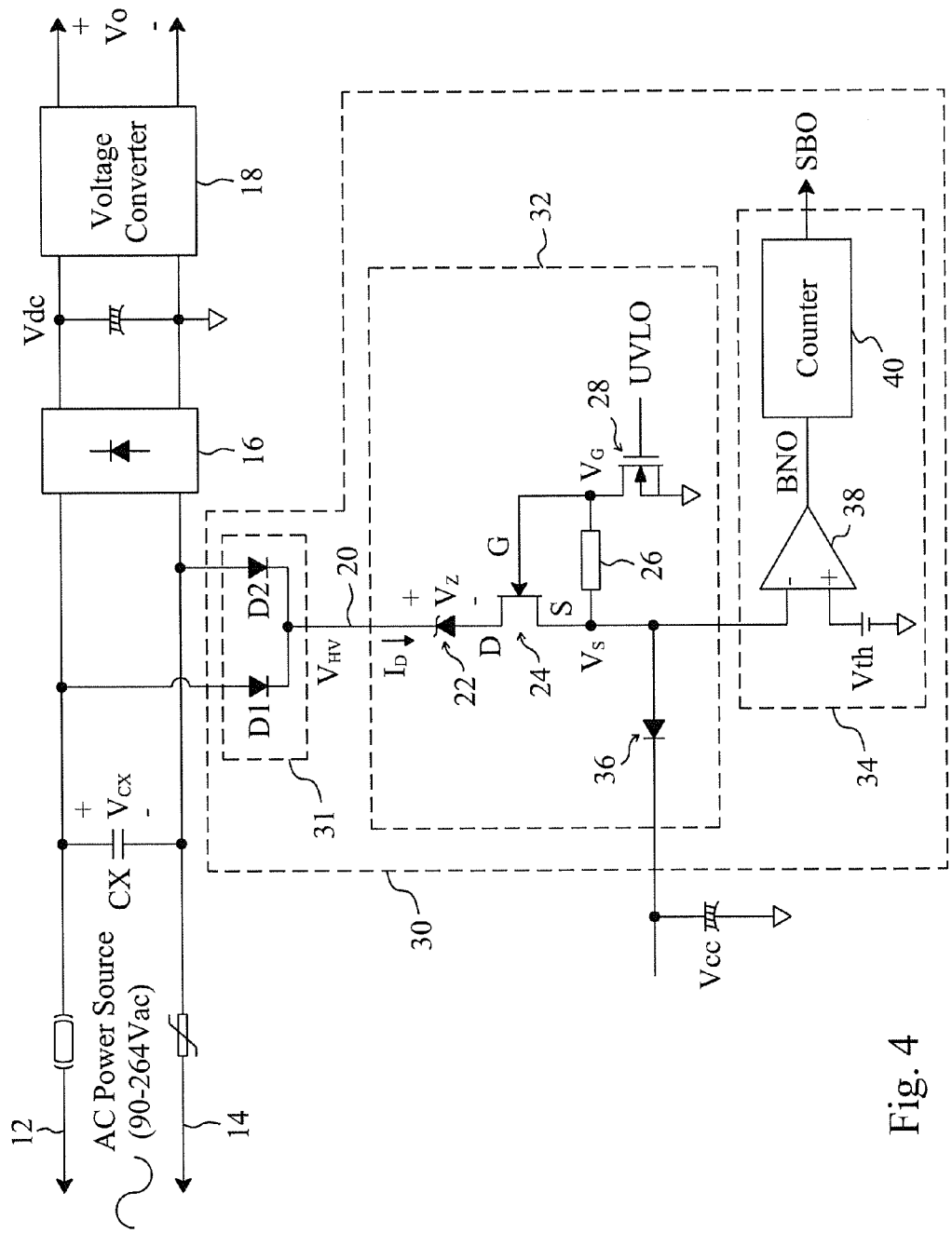
FIG. 4 is a circuit diagram of a brownout protection apparatus using the voltage detector of FIG. 2.

FIG. 4 is a circuit diagram of a brownout protection apparatus 30 using the voltage detector of FIG. 2, for detecting whether an AC-DC switching power converter is in brownout state. The brownout protection apparatus 30 has a rectifier circuit 31 connected to the two terminals of the high-frequency filter capacitor CX, a voltage detector 32 connected to the rectifier circuit 31, and a brownout detect circuit 34 connected to the voltage detector 32. The rectifier circuit 31 rectifies the voltage $V_{CX}$ across the high-frequency filter capacitor CX to generate a voltage $V_{HV}$, the voltage detector 32 detects the voltage $V_{HV}$ to generate a detection signal $V_S$, and the brownout detect circuit 34 determines whether to trigger a brownout protection signal SBO according to the detection signal $V_S$. The rectifier circuit 31 includes diodes D1 and D2, whose anodes are connected to the two terminals of the high-frequency filter capacitor CX, respectively, and whose cathodes are connected to the detect terminal 20 of the voltage detector 32. The voltage detector 32 has all the components as that of FIG. 2, except an additional diode 36 connected between the source S of the JFET 24 and the power supply capacitor Vcc. The power supply capacitor Vcc is a device providing a supply voltage to the AC-DC switching power converter. In this embodiment, when the switch 28 is off, if the voltage $V_{HV}$ is lower than the breakdown voltage $V_Z$ of the zener diode 22, the JFET 24 does not operates and there is no current $I_D$ flowing through the JFET 24; and if the voltage $V_{HV}$ is higher than the breakdown voltage $V_Z$, the JFET 24 operates and produces a current $I_D$ to charge the power supply capacitor Vcc through the JFET 24 and the diode 36. The diode 36 blocks any current coming from the power supply capacitor Vcc to ensure the detection signal $V_S$ stays at zero potential when the JFET 24 does not operates. In the brownout detect circuit 34, a comparator 38 has its negative and positive inputs receiving the detection signal $V_S$ and a threshold voltage Vth, respectively, and thus compares the detection signal $V_S$ with the threshold voltage Vth to generate a comparison signal BNO, and a counter 40 generates the brownout protection signal SBO according to the comparison signal BNO.

Figure 5:
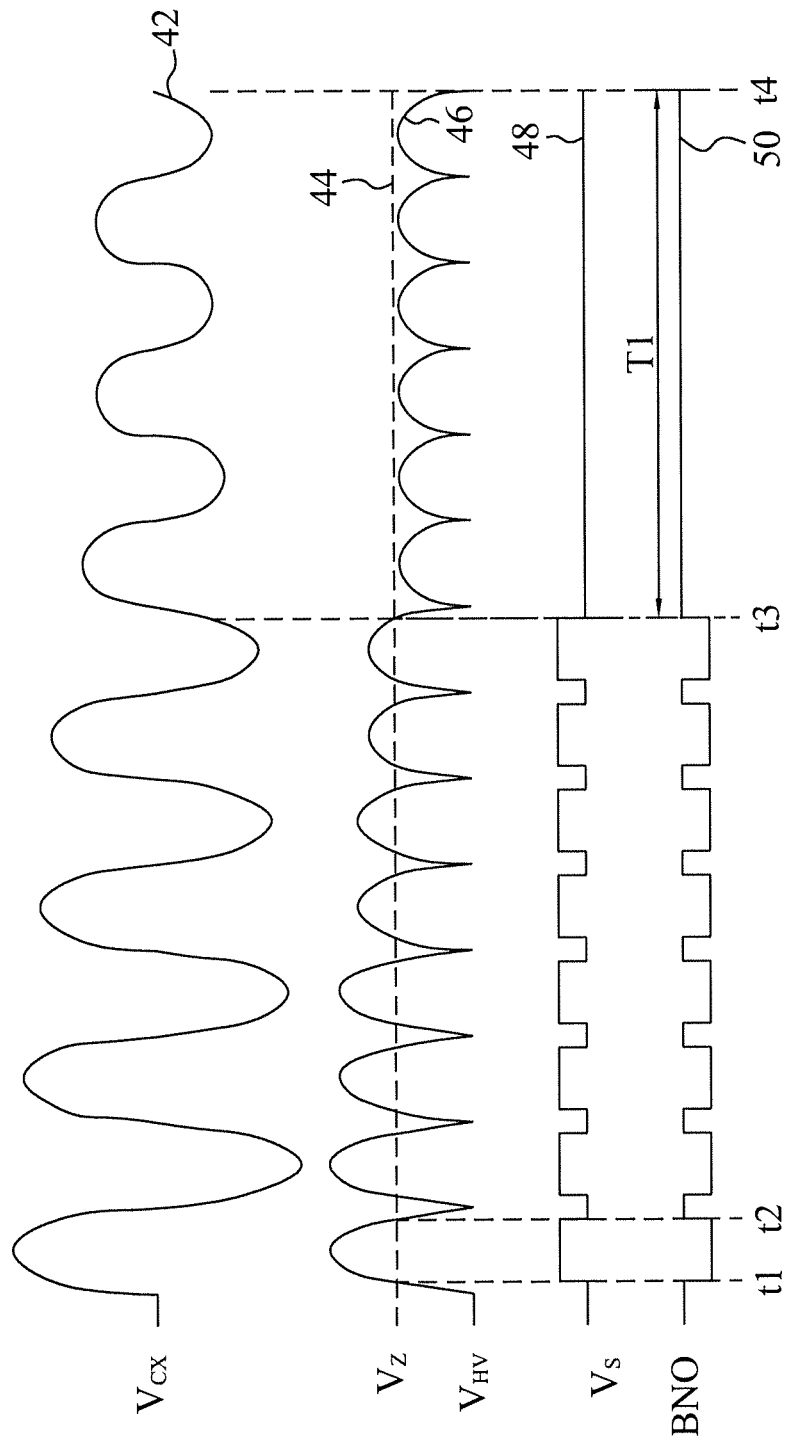
FIG. 5 is a waveform diagram of the circuit shown in FIG. 4.

FIG. 5 is a waveform diagram of the circuit shown in FIG. 4. Since the two terminals of the high-frequency filter capacitor CX are connected to an AC power source, the voltage $V_{CX}$ therebetween appears a sine-wave oscillation, as shown by waveform 42, and the rectifier circuit 31 rectifies the voltage $V_{CX}$ and thereby generates the voltage $V_{HV}$ as shown by waveform 46. During the switch 28 is on, at time t1 where the voltage $V_{HV}$ becomes higher than the breakdown voltage $V_Z$ of the zener diode 22, as shown by waveforms 44 and 46, the JFET 24 operates and produces a current $I_D$ flowing through the resistor 26, so the detection signal $V_S$ has the level $V_P$, as shown by waveform 48. Furthermore, the threshold voltage Vth is lower than $V_P$, and thus the comparison signal BNO remains low, as shown by waveform 50. When the voltage $V_{HV}$ becomes lower than the breakdown voltage $V_Z$ at time t2, the JFET 24 disables and there is no current $I_D$ flowing through the resistor 26, and thus the detection signal $V_S$ is at zero potential, thereby turning the comparison signal BNO to high. When the counter 40 detects that the comparison signal BNO remains high for a preset time T1, as shown from time t3 to time t4, it identifies that the AC power source is in brownout state, and the brownout protection signal SBO is triggered to stop the AC-DC switching power converter operating. The breakdown voltage $V_Z$ may be altered by selecting or adjusting the breakdown voltage $V_Z$ of the zener diode 22 or by adding more zener diodes 22 connected in series. Since this embodiment needs no resistor voltage divider to detect the voltage of the AC power source, power loss caused by a resistor voltage divider can be prevented. In addition, because the leakage current of the JFET 24 is close to zero, the voltage detector 32 has almost no power loss.

Figure 6:
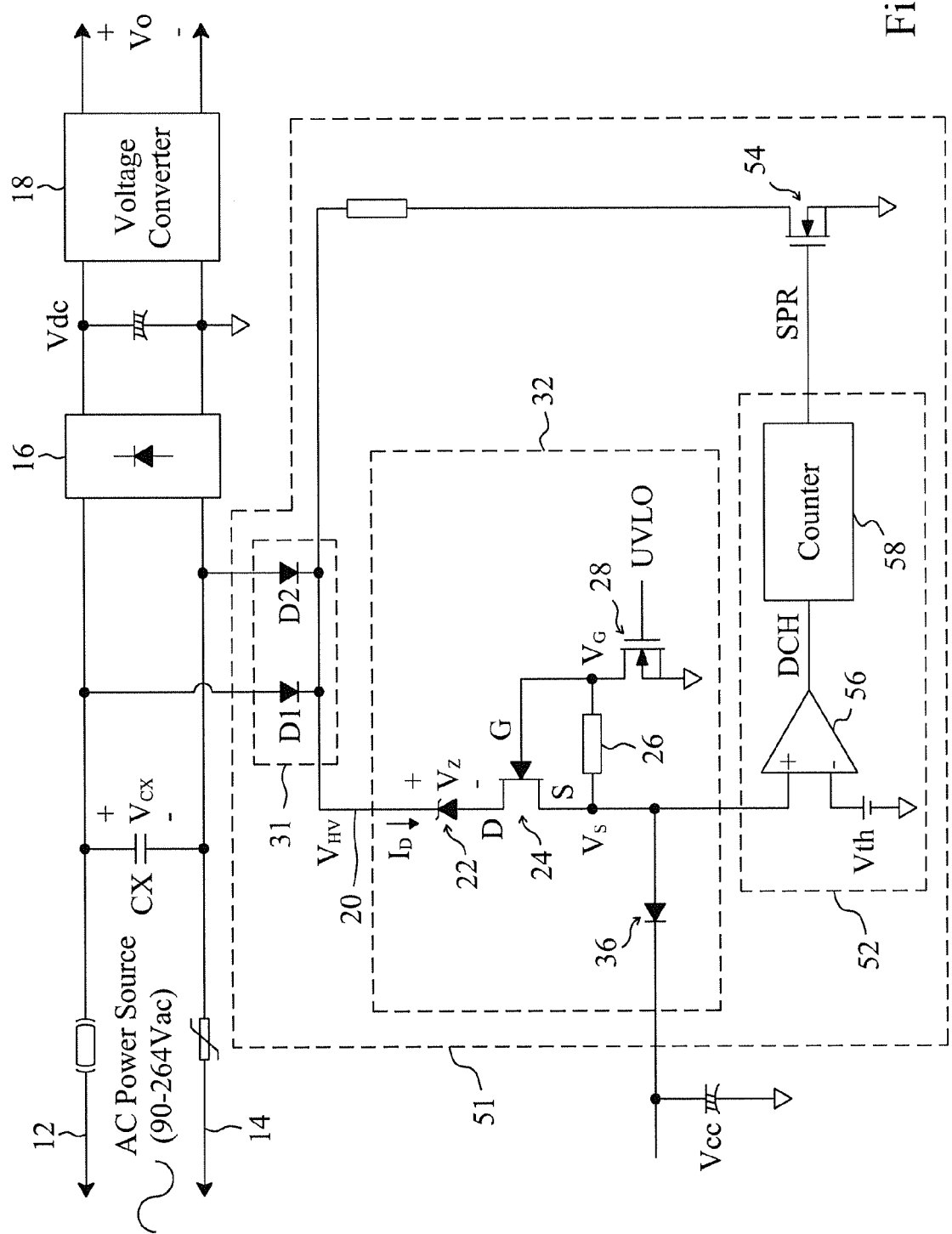
FIG. 6 is a circuit diagram of a power-source-removal protection apparatus using the voltage detector shown in FIG. 2.

FIG. 6 is a circuit diagram of a power-source-removal protection apparatus 51 using the voltage detector shown in FIG. 2, to detect whether the AC power source of an AC-DC switching power converter is removed. In addition to the rectifier circuit 31 and the voltage detector 32 as shown in FIG. 4, the power-source-removal protection apparatus 51 further includes a power-source-removal detect circuit 52 and a switch 54. According to the detection signal $V_S$ coming from the voltage detector 32, the power-source-removal detect circuit 52 generates a power-source-removal signal SPR. The switch 54 is connected to the two terminal of the high-frequency filter capacitor CX through the diodes D1 and D2 for discharging the high-frequency filter capacitor CX in response to the power-source-removal signal SPR. In the power-source-removal detect circuit 52, a comparator 56 has its positive and negative inputs receiving the detection signal $V_S$ and a threshold voltage Vth, respectively, and thus compares the detection signal $V_S$ with the threshold voltage Vth to generate a comparison signal DCH, and a counter 58 generates the power-source-removal signal SPR according to the comparison signal DCH. In this embodiment, when the switch 28 is off, if the voltage $V_{HV}$ is lower than the breakdown voltage $V_Z$ of the zener diode 22, the JFET 24 disables and there is no current $I_D$ flowing through the JFET 24; and if the voltage $V_{HV}$ is higher than the breakdown voltage $V_Z$, the JFET 24 operates and produces a current $I_D$ to charge the power supply capacitor Vcc through the JFET 24 and the diode 36. During the switch 28 is on, if the voltage $V_{HV}$ is higher than the breakdown voltage $V_Z$, the JFET 24 operates and produces a current $I_D$ flowing through the resistor 26, so the detection signal $V_S$ has the level $V_P$. The threshold voltage Vth is lower than $V_P$, and thus the comparison signal DCH is high. When the voltage $V^{HV}$ becomes lower than the breakdown voltage $V_Z$, the JFET 24 disables and there is no current $I_D$ flowing through the resistor 26, so the detection signal $V_S$ is at zero potential to make the comparison signal DCH at low.

In FIG. 6, the AC power source has an AC sine wave with a frequency of 47-63 Hz, or 94-126 Hz if the rectifier circuit 31 is a full-wave rectifier circuit. Thus, each cycle of 47-63 Hz, the voltage $V_{HV}$ shall cross over the breakdown voltage $V_Z$ to stop the JFET 24 from operating. In other words, the level of the comparison signal DCH will transit to high or low in each cycle of 47-63 Hz. When the AC power source is removed, the voltage $V_{CX}$ across the high-frequency filter capacitor CX presents a DC value. If the voltage $V_{CX}$ at this time is higher than the breakdown voltage $V_Z$, the comparison signal DCH stays at high. When the counter 58 detects that the comparison signal DCH remains high for a preset time T1, it identifies that the AC power source has been removed, and thus the power-source-removal signal SPR is triggered to make the high-frequency filter capacitor CX discharge until the voltage $V_{HV}$ becomes lower than the breakdown voltage $V_Z$ of the zener diode 22. The breakdown voltage $V_Z$ may be set lower than the minimum safe voltage, $60V_{peak}$, 42.4 Vac under a safe regulations, or even lower. The breakdown voltage $V_Z$ may be altered by selecting or adjusting the breakdown voltage $V_Z$ of the zener diode 22 or by adding more zener diodes 22 connected in series. Since this embodiment uses the active component 54 to make the high-frequency filter capacitor discharge instead of a bleeding resistor RB, no additional power loss will be caused.

Figure 7:
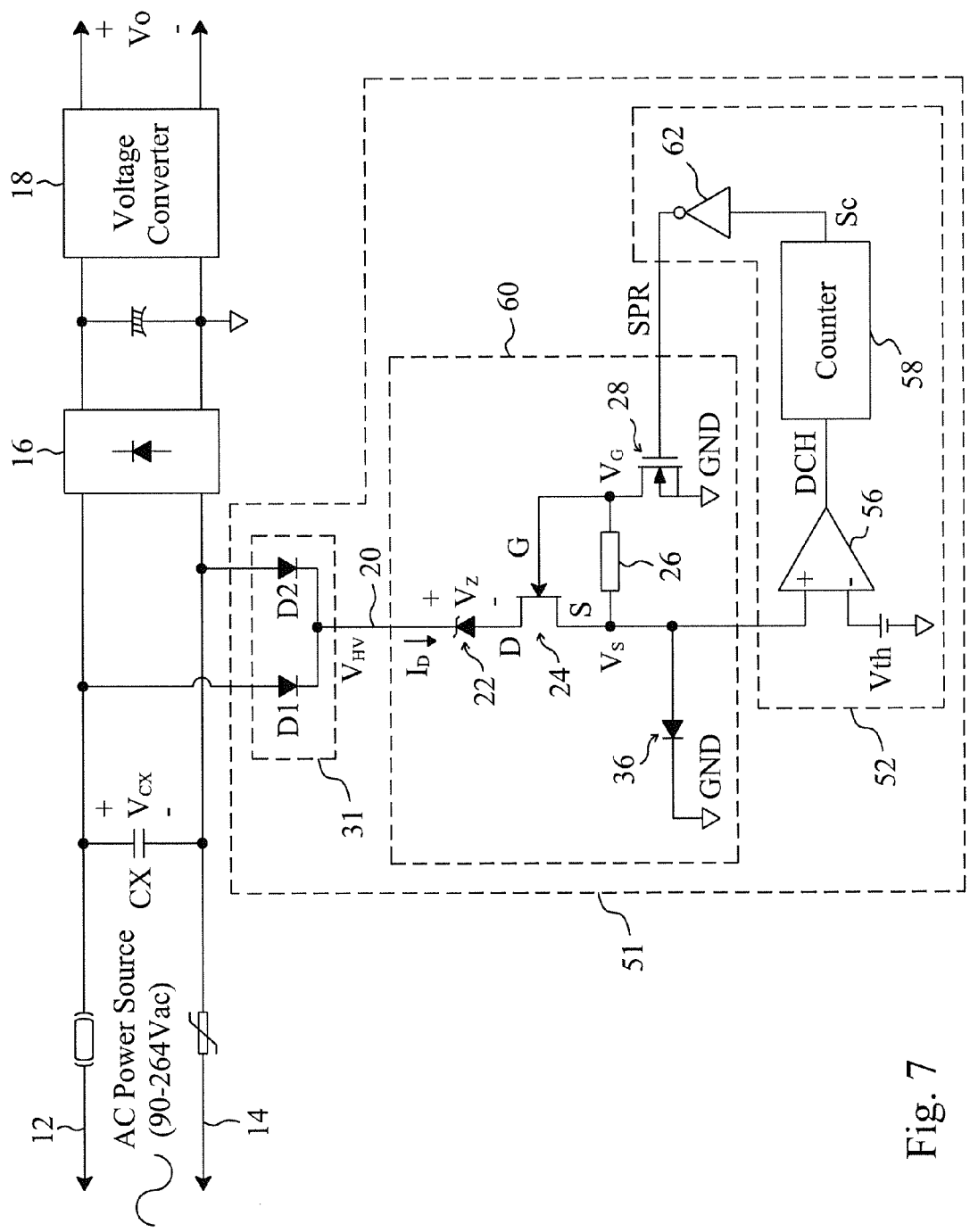
FIG. 7 is a circuit diagram of another embodiment for the power-source-removal protection apparatus of FIG. 6.

FIG. 7 is a circuit diagram of another embodiment for the power-source-removal protection apparatus 51 of FIG. 6. Except the power-source-removal detect circuit 52 and the voltage detector 60, all of the rest of the components are identical to those shown in FIG. 6. In the power-source-removal detect circuit 52, in addition to the comparator 56 and the counter 58, there is an inverter 62 for inverting a signal Sc provided by the counter 58 to generate the power-source-removal signal SPR. In the voltage detector 60, except that the diode 36 connected between the source S of the JFET 26 and the ground GND, and the switch 28 controlled by the power-source-removal signal SPR coming from the power-source-removal detect circuit 52, all of the rest of the components are identical to those in the voltage detector 32 of FIG. 6. In this embodiment, during the switch 28 is on, if the voltage $V_{HV}$ is higher than the breakdown voltage $V_Z$ of the zener diode 22, the JFET 24 operates and produces a current $I_D$ flowing through the resistor 26, so the detection signal $V_S$ has the level $V_P$. Also, the threshold voltage Vth is lower than $V_P$, and thus the comparison signal DCH is high. When the voltage $V_{HV}$ becomes lower than the breakdown voltage $V_Z$, the JFET 24 disables and there is no current $I_D$ flowing through the resistor 26. Consequently, the detection signal $V_S$ is at zero potential, and the comparison signal DCH turns to low. When the counter 58 detects that the comparison signal DCH stays at high for a preset time T1, it identifies that the AC power source has been removed, so the signal Sc is triggered, and the inverter 62 inverts the signal Sc to generate the power-source-removal signal SPR of low level to turn off the switch 28. At this time, since the voltage $V_{HV}$ is higher than the breakdown voltage $V_Z$, the voltage $V_{CX}$ across the high-frequency filter capacitor CX is released to the ground GND through the JFET 24 and the diode 36, until the voltage $V_{CX}$ becomes lower than the breakdown voltage $V_Z$ of the zener diode 22.

Figure 8:
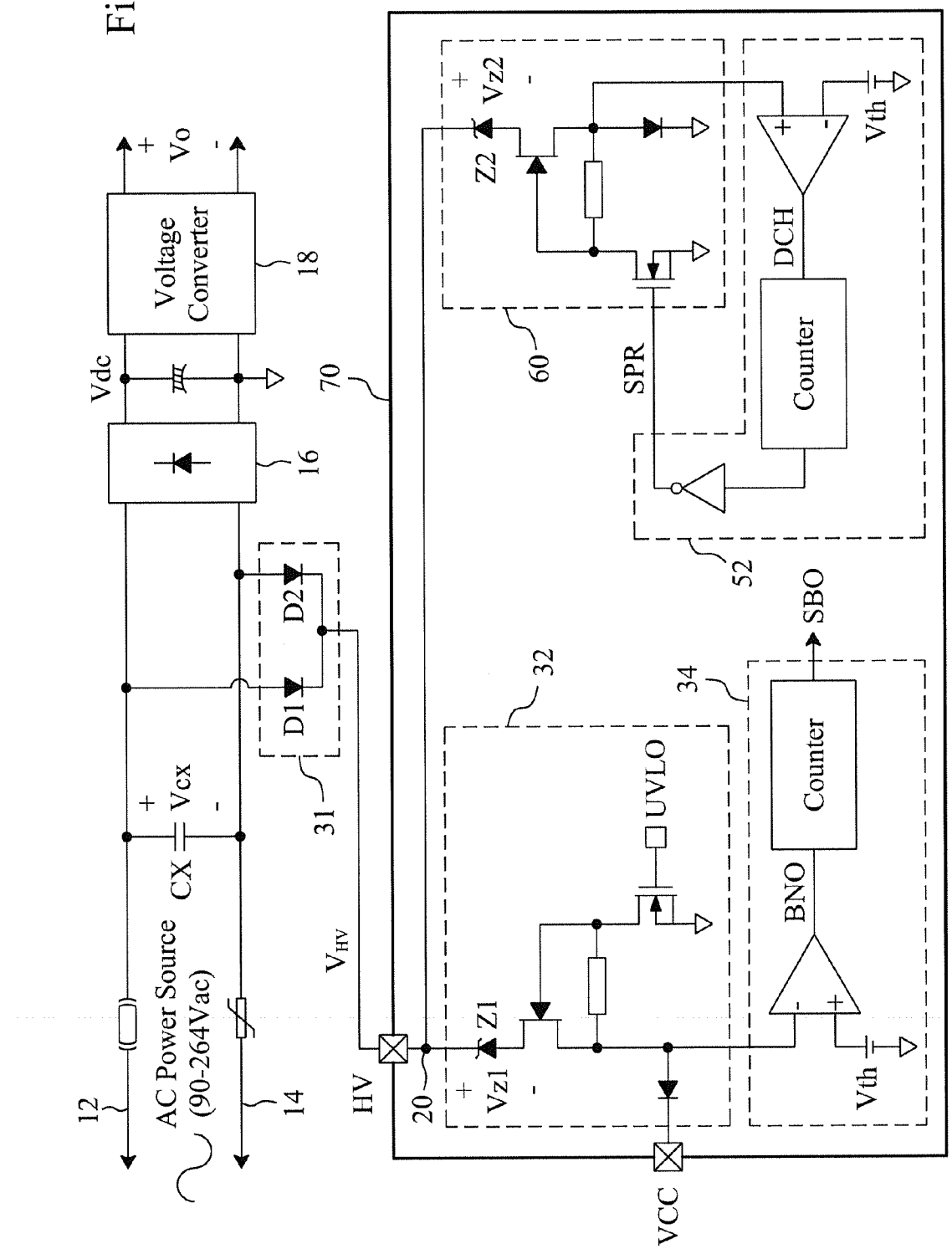
FIG. 8 is an AC-DC switching power converter using the voltage detector of FIG. 2 to realize brownout protection and power-source-removal detection.

FIG. 8 is an AC-DC switching power converter using the voltage detector of FIG. 2 to realize brownout protection and power-source-removal detection, which includes the AC power input terminals 12 and 14, high-frequency filter capacitor CX, bridge rectifier 16, rectifier circuit 31, voltage converter 18, voltage detector 32 and brownout detect circuit 34 of FIG. 4, as well as the power-source-removal detect circuit 52 and voltage detector 60 of FIG. 7, while the zener diodes in the voltage detectors 32 and 60 are Z1 and Z2, respectively. In this AC-DC switching power converter, the voltage detectors 32 and 60, brownout detect circuit 34 and power-source-removal detect circuit 52 are integrated on a control chip 70, and the detect terminals 20 of the voltage detectors 32 and 60 share a common pin HV. When the pin HV has its voltage $V_{HV}$ remaining lower than the breakdown voltage $V_{Z1}$ of the zener diode Z1 for a preset time T1, the brownout detect circuit 34 triggers the brownout protection signal SBO to turn off the AC-DC switching power converter. When the voltage $V_{HV}$ is higher than the breakdown voltage $V_{Z2}$ of the zener diode Z2 for the preset time T1, the power-source-removal detect circuit 52 triggers the power-source-removal signal SPR to discharge the high-frequency filter capacitor CX. In this embodiment, only one pin is sufficient for two protection functions. Furthermore, this embodiment needs neither a bleeding resistor RB for releasing the voltage $V_{CX}$ of the high-frequency filter capacitor CX, nor a resistor voltage divider for detecting the voltage of the AC power source, so power loss caused by such elements can be avoided.

Figure 9:
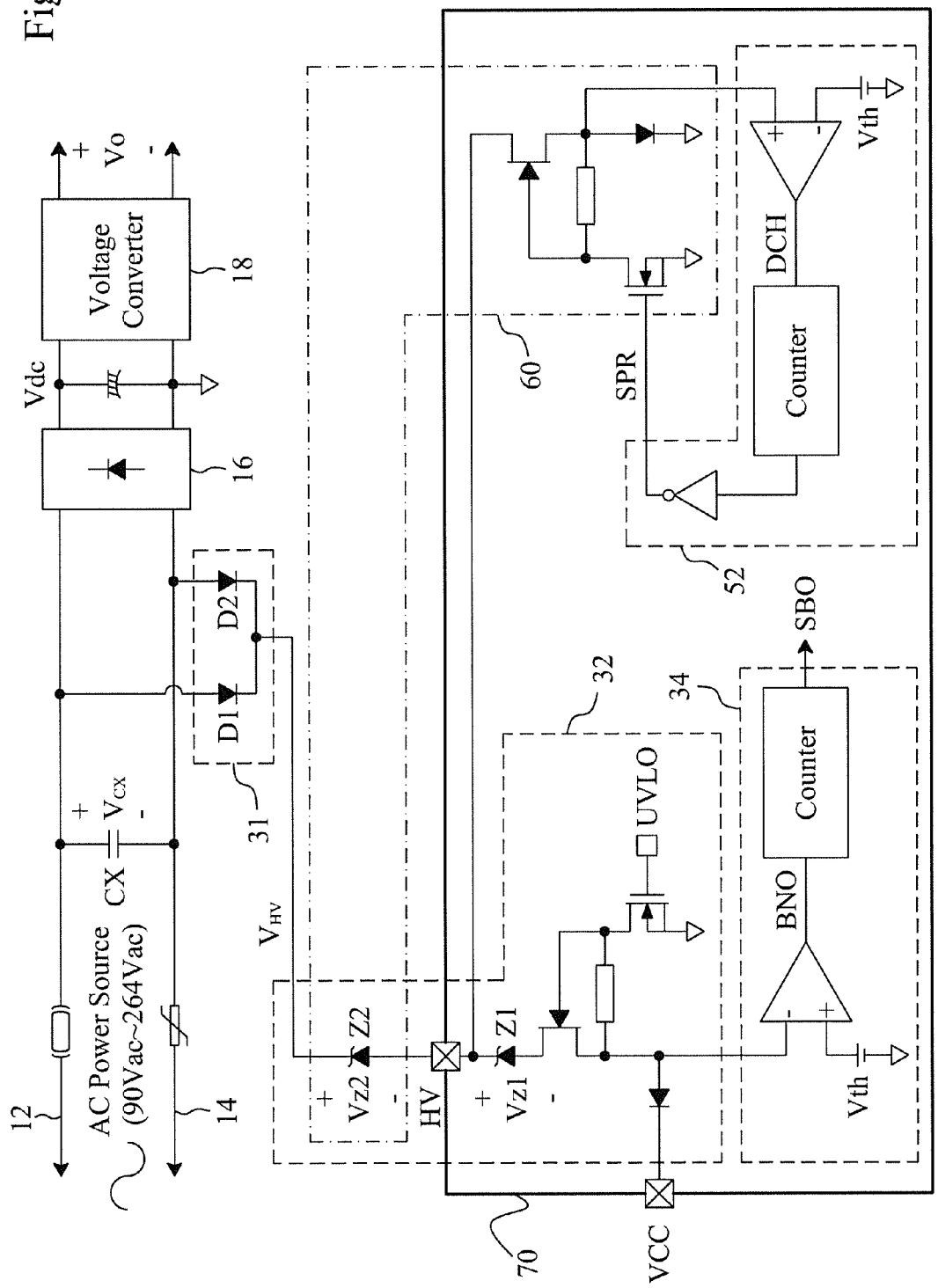
FIG. 9 is another AC-DC switching power converter using the voltage detector of FIG. 2 to realize brownout protection and power-source-removal detection.

FIG. 9 is another AC-DC switching power converter using the voltage detector of FIG. 2 to realize brownout protection and power-source-removal detection, which includes the AC input terminals 12 and 14, high-frequency filter capacitor CX, bridge rectifier 16, rectifier circuit 31, voltage converter 18, voltage detector 32, brownout detect circuit 34, power-source-removal detect circuit 52 and voltage detector 60 of FIG. 8, while the voltage detector 32 includes zener diodes Z1 and Z2 connected in series. In this AC-DC switching power converter, the voltage detectors 32 and 60 also share the common pin HV. When the voltage $V_{HV}$ on the pin HV remains lower than $V_{Z1}+V_{Z2}$ for a preset time T1, the brownout detect circuit 34 triggers the brownout protection signal SBO to turn off the AC-DC switching power converter. When the voltage $V_{HV}$ remains higher than $V_{Z2}$ for the preset time T1, the power-source-removal detect circuit 52 triggers the power-source-removal signal SPR to discharge the high-frequency filter capacitor CX.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A voltage detector for detecting an input voltage to generate a detection signal, the voltage detector comprising:
   a detect terminal for receiving the input voltage;
   a junction field effect transistor having an input terminal, an output terminal and a control terminal;
   a zener diode having a cathode connected to the detect terminal and an anode connected to the input terminal of the junction field effect transistor; and
   a resistor connected between the output terminal and control terminal of the junction field effect transistor;
   wherein the detection signal is derived from a voltage drop across the resistor.

2. The voltage detector of claim 1, further comprising a switch connected between the control terminal of the junction field effect transistor and a ground terminal, for connecting the control terminal to the ground terminal in response to a control signal.

3. A protection apparatus for an AC-DC switching power converter including a first and a second AC power input terminals for being connected to an AC power source, and a high-frequency filter capacitor connected between the first and second AC power input terminals for filtering out high-frequency noise, the protection apparatus comprising:
   a rectifier circuit connected to the two terminals of the high-frequency filter capacitor, for rectifying a first voltage across the high-frequency filter capacitor to generate a second voltage;
   a voltage detector connected to the rectifier circuit, for detecting the second voltage to generate a detection signal; and
   a brownout detect circuit connected to the voltage detector, for determining a brownout protection signal according to the detection signal.

4. The protection apparatus of claim 3, wherein the voltage detector comprises:
   a zener diode having a cathode connected to the rectifier circuit;
   a junction field effect transistor having an input tei minal, an output terminal and a control terminal, the input terminal connected to an anode of the zener diode;
   a resistor connected between the output terminal and control terminal of the junction field effect transistor; and
   a switch connected between the control terminal of the junction field effect transistor and a ground terminal, for connecting the control terminal to the ground terminal in response to a control signal;
   wherein the detection signal is derived from a voltage drop across the resistor.

5. The protection apparatus of claim 3, wherein the brownout detect circuit comprises:
   a comparator connected to the voltage detector, for comparing the detection signal with a threshold to generate a comparison signal; and
   a counter connected to the comparator, for triggering the brownout protection signal when the detection signal remains lower than the threshold for a preset time.

6. A protection apparatus for an AC-DC switching power converter including a first and a second AC power input terminals for being connected to an AC power source, and a high-frequency filter capacitor connected between the first and second AC power input tet minals for filtering out high-frequency noise, the protection apparatus comprising:
   a rectifier circuit connected to the two terminals of the high-frequency filter capacitor, for rectifying a first voltage across the high-frequency filter capacitor to generate a second voltage;
   a voltage detector connected to the rectifier circuit, for detecting the second voltage to generate a detection signal;
   a power-source-removal detect circuit connected to the voltage detector, for determining a power-source-removal signal according to the detection signal; and
   a switch connected between the high-frequency filter capacitor and a ground terminal, for discharging the high-frequency filter capacitor in response to the power-source-removal signal.

7. The protection apparatus of claim 6, wherein the voltage detector comprises:
   a zener diode having a cathode connected to the rectifier circuit;
   a junction field effect transistor having an input terminal, an output terminal and a control terminal, the input terminal connected to an anode of the zener diode;
   a resistor connected between the output terminal and control terminal of the junction field effect transistor; and
   a second switch connected between the control terminal of the junction field effect transistor and the ground terminal, for connecting the control terminal to the ground terminal in response to a control signal;
   wherein the detection signal is derived from a voltage drop across the resistor.

8. The protection apparatus of claim 6, wherein the power-source-removal detect circuit comprises:
   a comparator connected to the voltage detector, for comparing the detection signal with a threshold to generate a comparison signal;
   a counter connected to the comparator, for triggering the power-source-removal signal when the detection signal remains higher than the threshold for a preset time.

9. A protection apparatus for an AC-DC switching power converter including a first and a second AC power input terminals for being connected to an AC power source, and a high-frequency filter capacitor connected between the first and second AC power input terminals for filtering out high-frequency noise, the protection apparatus comprising:
   a rectifier circuit connected to the two terminals of the high-frequency filter capacitor, for rectifying a first voltage across the high-frequency filter capacitor to generate a second voltage;
   a voltage detector connected to the rectifier circuit, for detecting the second voltage to generate a detection signal; and
   a power-source-removal detect circuit connected to the voltage detector, for determining a power-source-removal signal for the voltage detector according to the detection signal;
   wherein the voltage detector discharges the high-frequency filter capacitor in response to the power-source-removal signal.

10. The AC-DC switching power converter of claim 9, wherein the voltage detector comprises:
   a zener diode having a cathode connected to the rectifier circuit;
   a junction field effect transistor having an input terminal, an output terminal and a control terminal, the input terminal connected to an anode of the zener diode;
   a resistor connected between the output terminal and control terminal of the junction field effect transistor;

a diode connected between the output terminal of the junction field effect transistor and a ground terminal; and a switch connected between the control terminal of the junction field effect transistor and the ground terminal, and controlled by the power-source-removal signal;

wherein the detection signal is derived from a voltage drop across the resistor.

11. The AC-DC switching power converter of claim 9, wherein the power-source-removal detect circuit comprises:

a comparator connected to the voltage detector, for comparing the detection signal with a threshold to generate a comparison signal;

a counter connected to the comparator, for triggering the power-source-removal signal when the detection signal remains higher than the threshold for a preset time.

* * * * *